United States Patent
Sahr et al.

(10) Patent No.: US 8,101,019 B2
(45) Date of Patent: Jan. 24, 2012

(54) METHOD FOR PRODUCING A MONOCRYSTALLINE OR POLYCRYSTALLINE SEMICONDUCTOR MATERIAL

(75) Inventors: Uwe Sahr, Nuremberg (DE); Matthias Mueller, Jena (DE); Ingo Schwirtlich, Miltenberg (DE); Frank-Thomas Lentes, Bingen (DE); Frank Buellesfeld, Frankfurt am Main (DE)

(73) Assignee: Schott AG, Mainz (DE)

( * ) Notice: Subject to any disclaimer, the term of this patent is extended or adjusted under 35 U.S.C. 154(b) by 586 days.

(21) Appl. No.: 12/334,646

(22) Filed: Dec. 15, 2008

(65) Prior Publication Data
US 2009/0158993 A1 Jun. 25, 2009

(30) Foreign Application Priority Data

Dec. 19, 2007 (DE) .......................... 10 2007 061 704
May 8, 2008 (DE) .......................... 10 2008 022 882

(51) Int. Cl.
C30B 15/14 (2006.01)
C30B 11/00 (2006.01)
C30B 21/04 (2006.01)
C30B 13/00 (2006.01)
C30B 28/08 (2006.01)
C30B 9/00 (2006.01)
C30B 17/00 (2006.01)
C30B 21/02 (2006.01)
C30B 28/06 (2006.01)
C30B 35/00 (2006.01)

(52) U.S. Cl. .................. 117/73; 117/3; 117/11; 117/37; 117/200

(58) Field of Classification Search ................ 117/3, 11, 117/37, 73, 200
See application file for complete search history.

(56) References Cited

U.S. PATENT DOCUMENTS

| | | | |
|---|---|---|---|
| 3,960,503 A * | 6/1976 | Rice ............................. | 117/214 |
| 4,353,726 A | 10/1982 | Rough, Sr. | |
| 5,080,873 A | 1/1992 | Ono et al. | |
| 5,412,882 A | 5/1995 | Zippe et al. | |
| 5,526,580 A | 6/1996 | Zippe et al. | |
| 5,739,376 A | 4/1998 | Bingel | |
| 6,454,851 B1 | 9/2002 | Fuerhoff et al. | |
| 6,743,293 B2 | 6/2004 | Katon | |
| 6,896,732 B2 | 5/2005 | Fickett et al. | |
| 7,179,331 B2 * | 2/2007 | Muhe et al. .................. | 117/200 |
| 7,227,196 B2 * | 6/2007 | Burgener et al. ............. | 257/103 |
| RE39,778 E * | 8/2007 | Kawase et al. .................. | 117/82 |

(Continued)

FOREIGN PATENT DOCUMENTS

DE 32 17 414 7/1983

(Continued)

Primary Examiner — James McDonough
(74) Attorney, Agent, or Firm — Michael J. Striker

(57) ABSTRACT

In the method of making a monocrystalline or polycrystalline semiconductor material semiconductor raw material is introduced into a melting crucible and directionally solidified using a vertical gradient freeze method. The molten material trickles downward, so that the raw material that has not yet melted gradually slumps in the melting crucible. The semiconductor raw material is replenished from above onto a zone of semiconductor raw material which has not yet melted or is not completely melted to at least partly compensate for shrinkage of the raw material and to raise the filling level. To reduce the melting time and influence the thermal conditions in the system as little as possible, the semiconductor raw material to be replenished is heated to a temperature below its melting temperature and introduced into the crucible in the heated state.

24 Claims, 6 Drawing Sheets

U.S. PATENT DOCUMENTS

| | | | |
|---|---|---|---|
| 7,261,774 B2 * | 8/2007 | Muhe | 117/81 |
| RE40,662 E * | 3/2009 | Kawase et al. | 117/73 |
| 2003/0159647 A1 | 8/2003 | Arvidson et al. | |
| 2004/0226504 A1 | 11/2004 | Nakashima et al. | |
| 2006/0060122 A1 | 3/2006 | Nakashima et al. | |
| 2007/0012238 A1 * | 1/2007 | Kretzer et al. | 117/19 |
| 2007/0151510 A1 * | 7/2007 | Muhe | 117/223 |

FOREIGN PATENT DOCUMENTS

| | | |
|---|---|---|
| DE | 43 13 481 | 10/1994 |
| DE | 198 55 061 | 5/2000 |
| DE | 199 34 940 | 2/2001 |
| EP | 0 315 156 | 5/1989 |
| EP | 1 162 290 | 12/2001 |
| EP | 1 337 697 | 8/2003 |
| EP | 1 338 682 | 8/2003 |
| EP | 1 820 885 | 8/2007 |
| JP | 62-260791 | 11/1987 |
| JP | 01148780 | 6/1989 |
| JP | 7-118089 | 5/1995 |
| JP | 11236290 | 8/1999 |
| JP | 2006-188376 | 7/2006 |

* cited by examiner

METHOD FOR PRODUCING A MONOCRYSTALLINE OR POLYCRYSTALLINE SEMICONDUCTOR MATERIAL

The present application claims priority of German patent application no. 10 2007 061 704.8 "Method for Producing a Monocrystalline or Polycrystalline Material", filed on Dec. 19, 2007 and German patent application no. 10 2008 022 882.6 "Method for Crystallization of a Semiconductor Material, in particular of Silicon", filed on May 8, 2008, the whole contents of which are hereby incorporated by reference.

FIELD OF THE INVENTION

The present invention relates to a method and a device for producing monocrystalline or polycrystalline material by way of directional solidification, in particular using what is known as the vertical gradient freeze method (referred to hereinafter as the VGF method), and relates in particular to a method and a device for producing polycrystalline silicon for applications in photovoltaics.

BACKGROUND OF THE INVENTION

Generally, solar cells for photovoltaics can be made of monocrystalline silicon or polycrystalline silicon. Whereas high-quality solar cells are made of silicon monocrystals, which is technologically more complex and thus more costly, less expensive solar cells are conventionally made of polycrystalline silicon, which is less complex and thus more cost-effective. Specifically in the production of polycrystalline silicon, features leading to a reduction in costs and in technological complexity therefore play an important part.

Conventionally, the melting crucible is filled with lumpy silicon. During the subsequent melting-on to form liquid silicon, there occurs in this case considerable volumetric shrinkage, caused by the significantly differing densities of molten silicon as compared to the previously present feedstock. Thus, in the case of conventional methods, only a small portion of the melting crucible volume can be effectively used. Various measures are known from the prior art to compensate for the volumetric shrinkage.

U.S. Pat. No. 6,743,293 B2 discloses a method for producing polycrystalline silicon, wherein an annular attachment having a corresponding profile is attached to the upper edge of the melting crucible in order to form overall a container construction having a larger volume. A silicon feedstock is introduced into the container construction. After the melting of the silicon, the silicon melt fills out the entire melting crucible, but not the volume enclosed by the annular attachment. However, the container construction requires a crystallization system having a greater volume, in particular a greater height; this is undesirable for reasons relating to energy. Furthermore, it is difficult to provide a suitably dimensionally stable annular attachment for reuse.

As an alternative to the above method, in crystallization systems which operate using the Czochralski method, continuous or discontinuous replenishment of lumpy raw material is known in order at least partly to compensate for the volumetric shrinkage caused by the melting of the raw material in the melting crucible.

EP 0 315 156 B1, which corresponds to U.S. Pat. No. 5,080,873, discloses a crystallization system of this type in which crystalline material is supplied to the melting crucible via a supply pipe. Deceleration means in the form of cross-sectional constrictions or profile bends are provided in the supply pipe in order to reduce the falling speed of the crystalline material. Active preheating of the crystalline material is not disclosed.

EP 1 338 682 A2, which corresponds to US 200310159647A1, discloses a crystallization system using the Czochralski method, wherein crystalline material slides into the melting crucible via an inclined pipe. JP 01-148780 A and English Abstract disclose a corresponding construction. However, in this case, complex measures must be taken to allow the introduction of crystalline raw material into the melting crucible without splashing. The reason for this is that splashing of the hot melt in the crystallization system leads to damage of components and to impurities which can be removed again only with difficulty. Active preheating of the crystalline material is not disclosed.

US 2004/0226504 A1 discloses a complex flap mechanism for suitably reducing the falling speed of the crystalline material during pouring into the melting crucible. US 2006/0060133 A1 discloses a crystallization system in which crystalline silicon falls from a vertical pipe down into the melting crucible. The lower end of the pipe is sealed by a conical shut-off body which imparts a radial movement component to the crystalline material. Active preheating of the crystalline material is not disclosed.

An alternative to the aforementioned mechanical solutions is a suitable selection of the process parameters in order partly to solidify the surface of the melt at the point in time at which crystalline material is replenished. This is disclosed for example in JP 11/236290 A or JP 62/260791 A and English Abstract thereof. However, the solidification of the surface of the melt in the melting crucible leads to undesirable slowing-down of the process.

EP 1 337 697 B1, which corresponds to U.S. Pat. No. 6,454,851 B1, discloses a crystallization system using the Czochralski method, wherein crystalline silicon is deposited only on islands of still solid silicon. These islands have to be determined with the aid of a video system and complex image evaluation. In order to strike these islands, the conveying means for conveying the crystalline silicon has to be moved in a suitable manner into the melting crucible, and this is complex.

In all of the crystallization systems operating using the Czochralski method, the melting crucible is heated from the base. In the production of crystalline materials using the VGF method, the raw material is melted on from above.

In the case of the aforementioned methods, the energy for heating up and melting on the silicon raw material is on the one hand introduced via heat conduction aid heat radiation firstly into the melting crucible, in order then to be forwarded via heat conduction and radiation to the material to be melted. On the other hand, the material to be melted is heated on the upper side mainly via heat radiation directly from the heaters. Heat is conveyed inside the melting crucible filled with the material to be melted also via heat conduction and heat radiation. In this case, the material properties, thermal conductivity and extinction play an important part. In addition, the heat conveyance properties are determined by the physical properties of the raw material, as the conduction of heat is impeded at the interfaces.

In order to operate as cost-effectively and energy-efficiently as possible, it is desirable to make the volume of the melting crucible as large as possible, in order also to obtain correspondingly large silicon crystals. The large crucible volume is accompanied by a longer melting-on time, as the amount of heat introduced into the crucible is limited by the size of the surface, which is effective for the absorption of heat, of the material to be melted. A further limitation results from the limitation of the crucible temperature, as the crucible materials do not withstand elevated temperatures and the sensitive material to be melted does not survive undamaged intensive overheating above the melting point without contact reaction with the crucible.

Absorbent materials can be heated via the introduction of electromagnetic alternating fields. In this case, suitable selection of the frequency allows a penetration depth which is adapted to the crucible dimensions to be selected, so that the material to be melted can be heated also in the volume. However, in the case of high temperature dependence and at a relatively high height of the melting crucible, electromagnetic heating is limited to regions close to the surface.

In order to allow more rapid melting-on of the raw material, the preheating of raw material during recharging into the melting crucible is known from the prior art.

DE 32 17 414 C1 discloses the preheating of cullet during recharging into a melting vat of a glass smelting plant. Used for this purpose is a plate heat exchanger, in the intervals in which cullet is constantly replenished. During operation the same amount of cutlet is supplied to the intervals and removed at the lower end thereof by a shaker (vibrating) conveyor. The waste gases which accumulate during the melting process are passed through the plate heat exchanger at a temperature of approximately 420° C., as a result of which the cullet is preheated to a temperature of approx. 245° C. Vertical movability of the plate heat exchanger prevents caking-on of the cullet and also bridging in the interspaces of the plate heat exchanger. However, the construction is comparatively complex.

DE 42 13 481 C1, which corresponds to U.S. Pat. No. 5,526,580 and U.S. Pat. No. 5,412,882, discloses a corresponding plate heat exchanger, wherein a drying step precedes the preheating of the cullet. For this purpose, the moisture in the material to be melted is evaporated in a dry zone in the feed region of the material to be melted by way of separate supply of hot heating gas in hot gas flows which have already cooled down.

Corresponding preheating by way of heat exchanger tubes is known from U.S. Pat. No. 4,353,726, also for the recharging of powdered materials in the manufacture of glass.

JP 07-277874 A and English Abstract thereof disclose the recharging of liquid silicon in the manufacture of monocrystalline silicon using the Czochralski method. For this purpose, a silicon raw material rod is melted on directly above the melting crucible with the aid of a melting heater. The melted-on silicon flows directly and continuously into the melting crucible.

JP 2006-188376 A discloses the production of a monocrystalline material using the Czochralski method, wherein polycrystalline raw material is recharged as a result of the fact that a rod-like polycrystalline raw material is melted on. For this purpose, the rod-like raw material is held in a holding body and immersed into a raw material melt in the melting crucible.

JP 07-118089 A discloses a method for producing a silicon monocrystal using the Czochralski method, wherein granular polycrystalline raw material is introduced into the melting crystal via a supply pipe. In order to prevent SiO formation during recharging, a reducing gas (i.e. hydrogen or a hydrogen/insert gas mixture) is blown onto the surface of the silicon melt.

SUMMARY OF THE INVENTION

The object of the present invention is to provide a method for producing a monocrystalline or polycrystalline material by way of directional solidification, allowing solid, lumpy semiconductor raw material to be replenished (added) to the melting crucible substantially without splashing, in order at least partly to counteract the volumetric shrinkage during the melting-on of the semiconductor raw material in the melting crucible and to attain a high filling level of the crucible. Preferably, a shorter melting-on time and more uniform heating should in this case be attained.

According to the invention, in the case of a VGF method, additional semiconductor raw material is replenished to the melting crucible from above onto a zone of semiconductor raw material which has not yet melted or is not completely melted, in order at least partly to compensate for the volumetric shrinkage of the semiconductor raw material in the melting crucible. In the case of the method according to the invention, the semiconductor raw material is heated in the melting crucible from above, for example by an upper heater extending substantially over the entire cross section of the melting crucible and arranged thereabove. Thus, the semiconductor raw material in the melting crucible melts from above, so that the formation of the islands in the upper crucible region is not promoted. On the contrary, the melt formed at the upper edge of the melting crucible trickles downward, where said melt fills out intervals located therebelow in the semiconductor raw material or alters the structure of the semiconductor raw material located therebelow, in particular melts on the surface thereof. Overall, the surface of the semiconductor raw material in the melting crucible is, even after reaching the melting temperature, more solid than liquid, so that the additionally introduced lumpy or crystalline semiconductor raw material leads to no or hardly any splashing in the melting crucible. This zone extends preferably over the entire cross section of the melting crucible. Overall, the invention therefore allows a shorter melting-on time and more uniform heating to be attained.

According to a further embodiment, the semiconductor raw material to be additionally introduced is heated outside the crucible receiving the melt by the purposeful introduction of heat to a temperature below the melting temperature of the semiconductor raw material and subsequently introduced in the heated state into the container. The invention allows the temperature conditions in the melting crucible to be controlled more effectively. The reason for this is that the introduced semiconductor raw material, which is heated almost to the melting temperature, then influences the temperature conditions in the melting crucible only slightly. Thus, use may be made of any desired heating methods, including in particular the introduction of electromagnetic radiation from above onto the melt. At the same time, the semiconductor raw material to be introduced can be heated in a controlled manner, and this further improves more precise definition of the process parameters. The invention allows more rapid melting-on to be attained, wherein it is according to the invention immaterial whether the melting crucible contains semiconductor material which has already melted or has not yet melted.

Expediently, according to a further embodiment, the semiconductor raw material is heated during transportation into the melting crucible, but outside the melting crucible. Preferably, the semiconductor raw material to be introduced is for this purpose moved past a heat source using a conveying means. Varying the conveying speed and/or the intensity of the heating thus allows the heating of the semiconductor raw material easily to be controlled.

According to a further embodiment, less energy is lost when the purposeful introduction of heat into the semiconductor raw material to be introduced takes place on the inside of heat insulation of the melting furnace receiving the melting crucible. However, in principle, the introduction of heat can also take place in the region of the heat insulation or else on the outside thereof.

Preferably, according to a further embodiment, the introduction of heat takes place under the action of electromagnetic radiation. For this purpose, the raw material to be introduced is spread flat or distributed in a suitable manner, to form a comparatively thin semiconductor raw material layer, the thickness of which allows sufficient action of the electromagnetic radiation. For this purpose, heat radiation or radiation from an optical radiation source, in particular a laser, or else microwave radiation or high or medium-frequency radiation can act on the semiconductor raw material to be introduced.

According to a further embodiment, for transporting the semiconductor raw material, use is preferably made of a conveying means which is designed to spread flat or to distribute the solid, lumpy semiconductor raw material. For this purpose, use may be made in particular of a shaker (vibrating) conveyor which has a predetermined width and is configured such that the semiconductor raw material is spread flat, preferably in a single layer or double layer.

According to a further embodiment, a flushing gas sweeps over the semiconductor raw material during transportation through the conveying means in the opposite direction to the direction of conveyance, in order to free the heated semiconductor raw material of adsorbed $H_2O$ and the like. The flushing gas used is preferably a suitably heated inert gas, such as for example $N_2$ or Ar, which can also contain a reducing gas, such as for example hydrogen.

Most particularly preferably, according to a further embodiment, the semiconductor raw material is introduced discontinuously into the crucible or heated and introduced into the crucible in accordance with the respective filling level in the melting crucible. Preferably, material is replenished to the melting crucible until the melt extends up to close to the upper edge of the melting crucible.

BRIEF DESCRIPTION OF THE DRAWINGS

The invention will be described hereinafter in an exemplary manner and with reference to the appended drawings, in which.

DETAILED DESCRIPTION OF PREFERRED EXEMPLARY EMBODIMENTS

Figure 1:
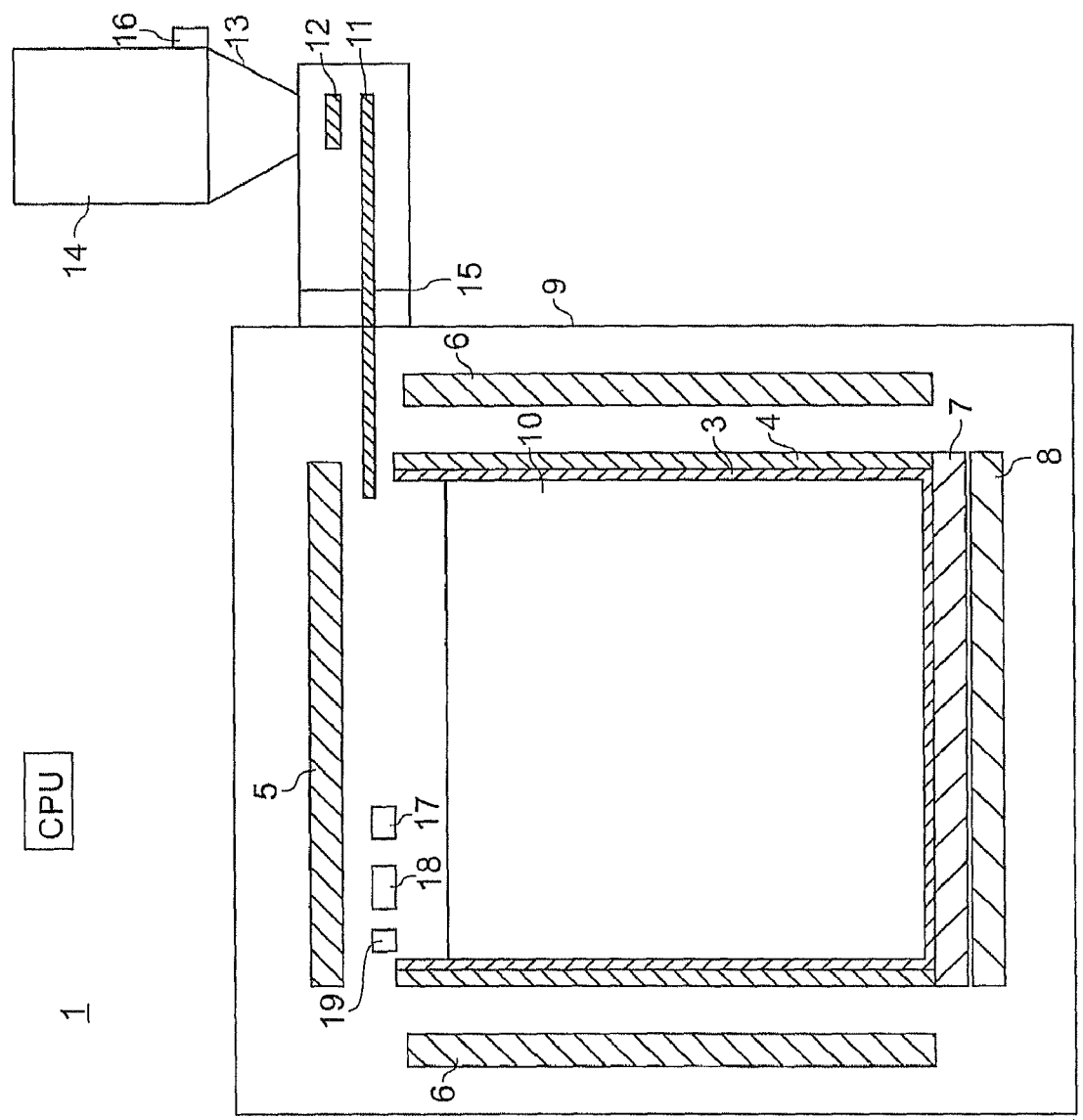
FIG. 1 is a schematic cross section of a crystallization system according to a first embodiment of the present invention.

According to FIG. 1, the crystallization system, which is denoted in its entirety by reference numeral 1, comprises a quartz crucible 3 which is received completely and in a tightly abutting manner in a box-like, upwardly open support system 4 in order to offer sufficient mechanical support to the quartz crucible 3 which has softened at the melting temperature of silicon. The quartz crucible 3 reaches up to the upper edge of the support system 4, thus ruling out direct contact of the silicon melt with graphite or other contaminating materials. The quartz crucible 3 is a commercially available quartz crucible having a base area of for example 550×550 mm², 720×720 mm or 880×880 mm² and has an inner coating as the separating layer between $SiO_2$ of the crucible and silicon. An upper heater 5, the base area of which is larger than or equal to the base area of the crucible, is provided above the crucible. Arranged on the lateral faces of the crucible is a jacket heater 6 surrounding said crucible. In this case, the distance between the jacket heater 6 and the crucible wall is constant over the entire circumference of the crucible.

Arranged below the crucible is a cooling plate 8 through which a coolant can flow. An insulating plate or crucible mounting plate 7 is arranged between the crucible and the cooling plate 8. In this case, the actual mount of the aforementioned crucible is embodied in such a way that a gap is formed between the crucible mounting plate 7 supporting the crucible and the cooling plate 8. In the case of the VGF crystallization method, all heaters 5, 6 are temperature-controlled. For this purpose, the surface temperatures of the heaters 5, 6 are detected by pyrometers at a suitable location and input into a control unit which controls or regulates the voltage applied to the heaters 5, 6. More precisely, in the case of the VGF method, an axial temperature gradient is built up using a stationary crucible. The temperature profile is displaced by way of electronic variation of the heater temperature in such a way that the phase boundary separating the liquid phase from the crystallized-out silicon migrates, starting from the base of the crucible, gradually toward the upper edge of the crucible. This leads to directional solidification of the liquid silicon to form polycrystalline silicon. The temperature control takes place in this case in such a way that isotherms which are as planar as possible are formed in the melting crucible.

In this case, the jacket heater can be configured to build up (establish) a temperature gradient from the upper edge to the lower edge of the melting crucible. For this purpose, the jacket heater 6 can also be divided into two or more segments which are arranged vertically one above the other and display heating power decreasing from the upper edge toward the lower end of the melting crucible. The segments arranged at the same level lead to the formation of planar, horizontal isotherms and thus to the formation of a planar, horizontal phase boundary.

The crucible has preferably a polygonal cross section, in particular a rectangular or square cross section. This allows wastage for the manufacture of the conventionally polygonal, in particular rectangular or square, solar cells for photovoltaics to be minimized.

The entire crystallization system 1 is surrounded by a preferably pressure-proof or gas-tight sheath 9, thus allowing an inert or reducing protective gas atmosphere to be built up inside.

According to FIG. 1, laterally to the crystallization system, a replenishment container 14 for replenishment of solid silicon is coupled to the crystallization system 1. The solid silicon is pourable (free-flowing), lumpy silicon having a suitable shape and bulk density. Preferably, this silicon is crystalline silicon. Provided at the lower end of the container 14 is a replenishment funnel 13 which is directed toward a second conveying means, so that silicon material slides out of the container 14 onto the second conveying means 12. A metering mechanism, for example a flap or a valve, is provided at the lower end of the funnel 13. The second conveying means is located preferably completely outside the crystallization system 1, in particular outside the heated region of the crystallization system. According to FIG. 1, the second conveying means 12 conveys the semiconductor raw material parallel to the plane of the drawing of FIG. 1. A first conveying means 11 follows the second conveying means 12. The first conveying means 11 protrudes into the heated region of the crystallization system 1, for example by about ⅓ of its overall length, and protrudes at its leading end roughly up to the center of the melting crucible.

The conveying means 11, 12 are conventional shaker conveyors which convey the semiconductor raw material via thermally stable shaker conveyors, made for example of silicon carbide. According to the invention, the use of fiber composite ceramics such as for example CFC or CSiC (carbon fiber-reinforced carbon or silicon carbide) has proven to be a particularly advantageous material for the shaker conveyors. The crystallization system 1 thus has two independent conveying means 11, 12 which are arranged one above the other, thus allowing the semiconductor raw material conveyed by the first conveying means 11 to be discharged completely into the melting crucible. The repeated replenishment of predetermined batches can be accomplished easily and without the risk that semiconductor raw material to be replenished melts and adheres to the shaker channel of conveying means 11 due to local overheating caused by the pre-heating of the semiconductor raw material, which will be described below in more detail.

As will be readily apparent to a person skilled in the art, use may also be made, in the case of the crystallization system according to the invention, of any other desired conveying means which are sufficiently stable to heat and can convey pourable or free-flowing semiconductor raw material into the melting crucible.

A sensor 16, which can detect the amount of semiconductor raw material issued, is associated with the replenishment container 14. This detection can take place in particular mechanically, preferably by detecting the current weight of the second conveying means 12, or can take place acoustically, optically or in another contactless manner. Furthermore, a temperature sensor 17 is arranged above the melting crucible for detecting the surface temperature of the crucible filling 10. The sensor 17 can be a pyrometer. Also located above the crucible is a visual inspection system 18 which detects or monitors the entire surface of the crucible filling 10, in particular by means of a video camera (not shown), the images of which are read out and evaluated in the central control means (CPU). For this purpose, use may be made of suitable image evaluation algorithms, as will be described hereinafter in greater detail. According to FIG. 1, a distance sensor 19, which measures the distance from the surface of the crucible filling 10 to the sensor 19, is also arranged above the crucible. Preferably, a laser distance measuring apparatus is used for this purpose. Thus, if the height of the distance sensor 19 above the base of the crucible is known, the current filling level in the melting crucible can be continuously detected.

The entire crystallization system 1 is operated under the control of a central open and closed-loop control means (CPU) which is responsible not only for suitable open or closed-loop control of the heaters 5, 6 and also of the cooling plate 8 but rather also for controlling the replenishment of silicon semiconductor raw material by way of metered dispensing from the replenishment container 14 and controlling the conveying means 11, 12 and also for the evaluation of the sensors 16 to 19.

Figure 2:
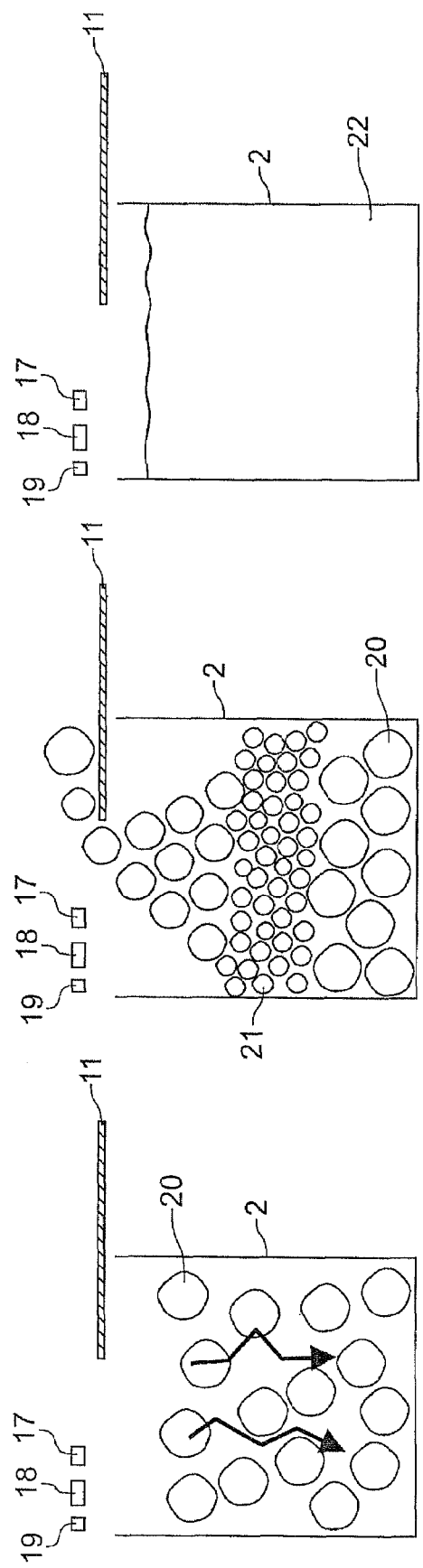
FIGS. 2a to 2c show three different phases during the melting-on of the crystalline semiconductor raw material in the melting crucible according to FIG. 1.

Firstly, the principle of the VGF method according to the invention for producing polycrystalline silicon will be described hereinafter with reference to FIGS. 2a to 2c. According to FIG. 2a, at the start of the process the melting crucible 2 is filled up to its upper edge with a suitable silicon feedstock 20. For melting on the silicon, the upper heater of the crystallization system heats the silicon feedstock from above to a temperature above the melting temperature of silicon. In addition, the energy can also be supplied via the lateral jacket heater 6 (cf FIG. 1) and if appropriate via a base heater. The silicon feedstock 20 is therefore firstly melted on at the upper edge of the melting crucible 2. As indicated by the arrows, the melted-on, liquid silicon then drips or trickles downward through the silicon feedstock located therebelow. During the trickling downward, the silicon feedstock located therebelow is partly melted on, so that the shape and bulk density thereof also change as a result of partial resolidification. Overall, this leads, as shown in FIG. 2b, to the formation of what is known as a "sludge zone" 21 at the upper edge of the crucible filling. This zone 21 extends in the form of one or more thin strips over the entire cross section of the melting crucible 2 and consists of semiconductor raw material which has not yet melted or is not completely melted. In this state, the crucible filling in the melting crucible 2 has slumped or shrunk by a certain distance; this is detected by the distance sensor 19. The slumping can also be identified with the aid of the visual inspection system 18 and suitable image evaluation. During the process, the temperature sensor 17 detects continuously the temperature of the surface of the crucible filling. In particular, the temperature sensor 17 is used to detect whether and at what point in time the surface temperature of the crucible filling reaches or exceeds the melting temperature of the semiconductor raw material. As will be described hereinafter in greater detail, the central control means triggers, in the event of a suitable formation of the sludge zone 21, as detected by the sensors 17 to 19, the replenishment of silicon raw material 20. Triggered for this purpose, as described hereinbefore, are the issuing of silicon raw material from the replenishment container 14 (cf. FIG. 1) and the actuation of the conveying means 12, 11. The amount of silicon raw material 20 that is actually fed into the melting crucible 2 is detected with the aid of the conveying sensor 16 associated with the replenishment container 14. The central control means ensures that not too much silicon raw material 20 is added or replenished, in particular that said silicon raw material does not protrude beyond the upper edge of the melting crucible 2. The replenishment (adding) of silicon raw material 20 can take place continuously or in a plurality of time-delayed process steps, as will be described hereinafter in greater detail. The conveying sensor 16 can in this case interact with a blocking element (not shown), for example a blocking slide, as will be described hereinafter in greater detail with reference to FIG. 3 to 6, and/or the position of the blocking element (not shown) can be controlled by the central CPU 1 in order selectively to block or to control the issuing of semiconductor raw material to the conveying means 12.

Finally attained is the state according to FIG. 2c, in which the melting crucible 2 is filled right up to its upper edge with a silicon melt 22. In this state, the further cooling-down and solidification of the silicon melt 22 take place to form polycrystalline silicon using the known VGF method. After the process there remains a silicon ingot, the cross section of which corresponds to that of the melting crucible 2. In order to minimize wastage during the manufacture of photovoltaic elements, the melting crucible 2 is according to the invention polygonal, in particular rectangular or square.

Further preferred embodiments of crystallization systems according to the present invention will be described hereinafter with reference to FIG. 3 to 6. In principle, these have the same construction as in accordance with the first embodiment. Thus, mainly the differences from a crystallization system according to the first embodiment will be presented hereinafter, wherein it should expressly be noted that the features of the various embodiments, as described and disclosed in the present document, can in principle be combined with one another in any desired manner.

Figure 3:
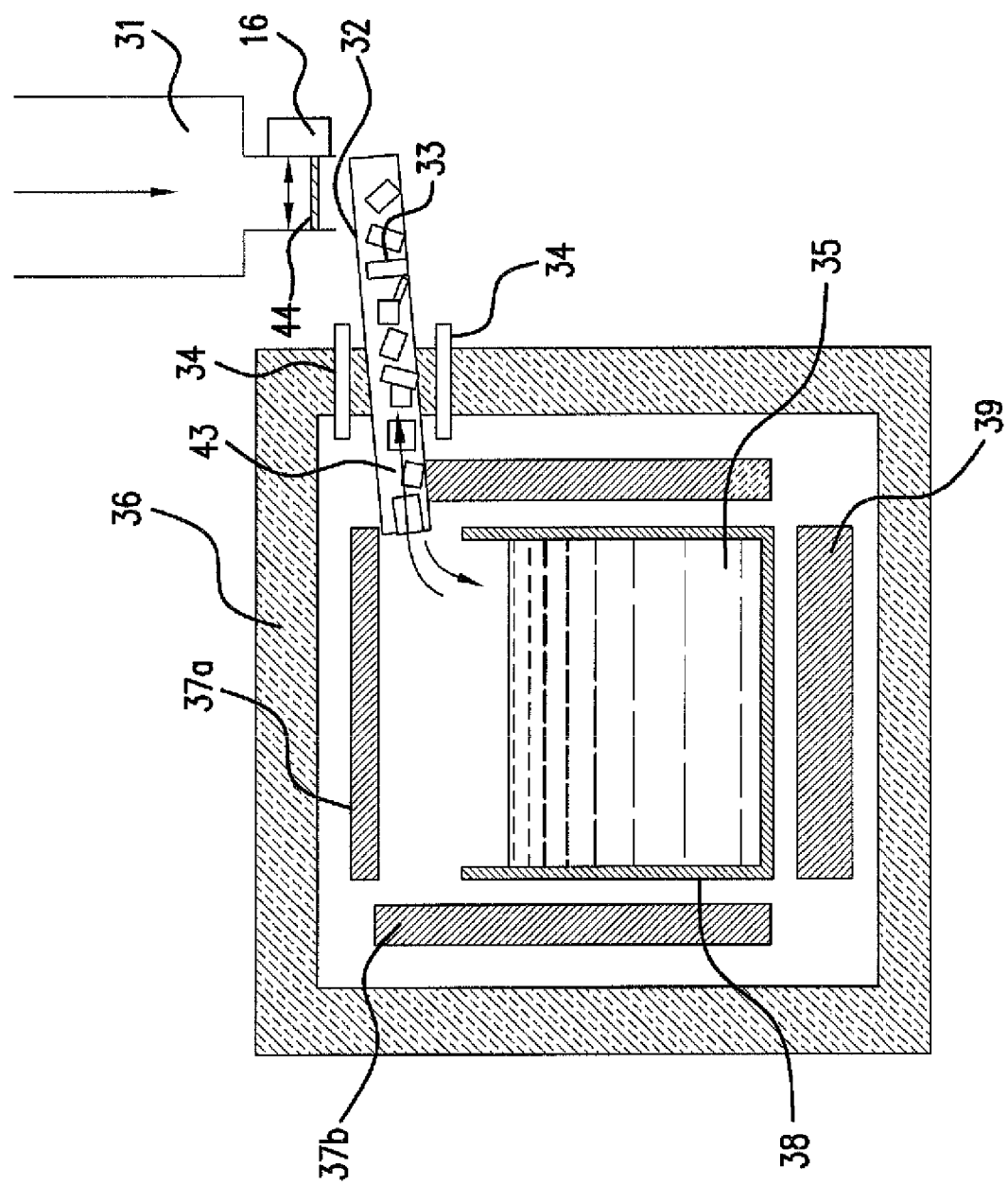
FIG. 3 is a schematic sectional view of a device for producing monocrystalline or polycrystalline silicon according to a further embodiment of the present invention.

According to FIG. 3, a conveying means 32 protrudes through the heat insulation 36 into the interior of the melting furnace in order to convey solid, lumpy semiconductor raw material 33 to be replenished from the lower end of the supply and metering container 31 into the melting crucible 38. According to the embodiments to be described hereinafter, the solid, lumpy raw material 33 is heated during transportation of the supply and metering container 31 into the melting crucible 38 by the purposeful introduction of heat to a temperature below the melting temperature of the raw material. The heated raw material then falls from the leading end of the conveying means 32, following gravity, down into the melting crucible 38. The temperature to which the raw material is heated should on the one hand be as little as possible below the actual melting temperature, in order to influence as little as possible the thermal conditions within the melting crucible 38 and the heat insulation 36, but is on the other hand defined, by controlling the heating power of a heating means associated with the conveying means 32, in such a way that undesirable clinging or adhering of raw material 33 to the conveying means 32 does not occur, in any case not to an extent which disturbs the process as a whole.

According to FIG. 3, use is made, for heating the raw material 33, of a tube furnace which is formed by heating elements 34 arranged in the region of the heat insulation 36 and surrounds the conveying means 32 in certain portions. The conveying means 32 which is composed of the combination of a shaker and a shaker channel comprises a shaking channel 32. A particular advantageous material for the shaker channel is again CFC or silicon carbide (SiC). In this case too, the use of fiber composite ceramics such as for example CFC or CSiC (carbon fiber-reinforced carbon or silicon carbide) has proven to be a particularly advantageous material for the channels, as stated hereinbefore with regard to the first embodiment. The shaking channel at the same time spreads flat the raw material to be introduced, so that heat can be introduced, in the region of the tube furnace 34, into the raw material which has already been spread flat. In this case, the raw material is conveyed spread flat preferably as a single or double layer, the thickness of the single or double layer being preferably smaller than the depth to which electromagnetic radiation penetrates the raw material to be introduced. According to FIG. 3, a flushing gas 43 sweeps in countercurrent over the solid, lumpy raw material transported on the shaking channel 32, after the heating means 34, in order to free the preheated raw material of adsorbed $H_2O$ and further residual gases. The flushing gas 43 can in this case also contain a reducing gas, for example hydrogen in a suitable concentration.

Figure 4:
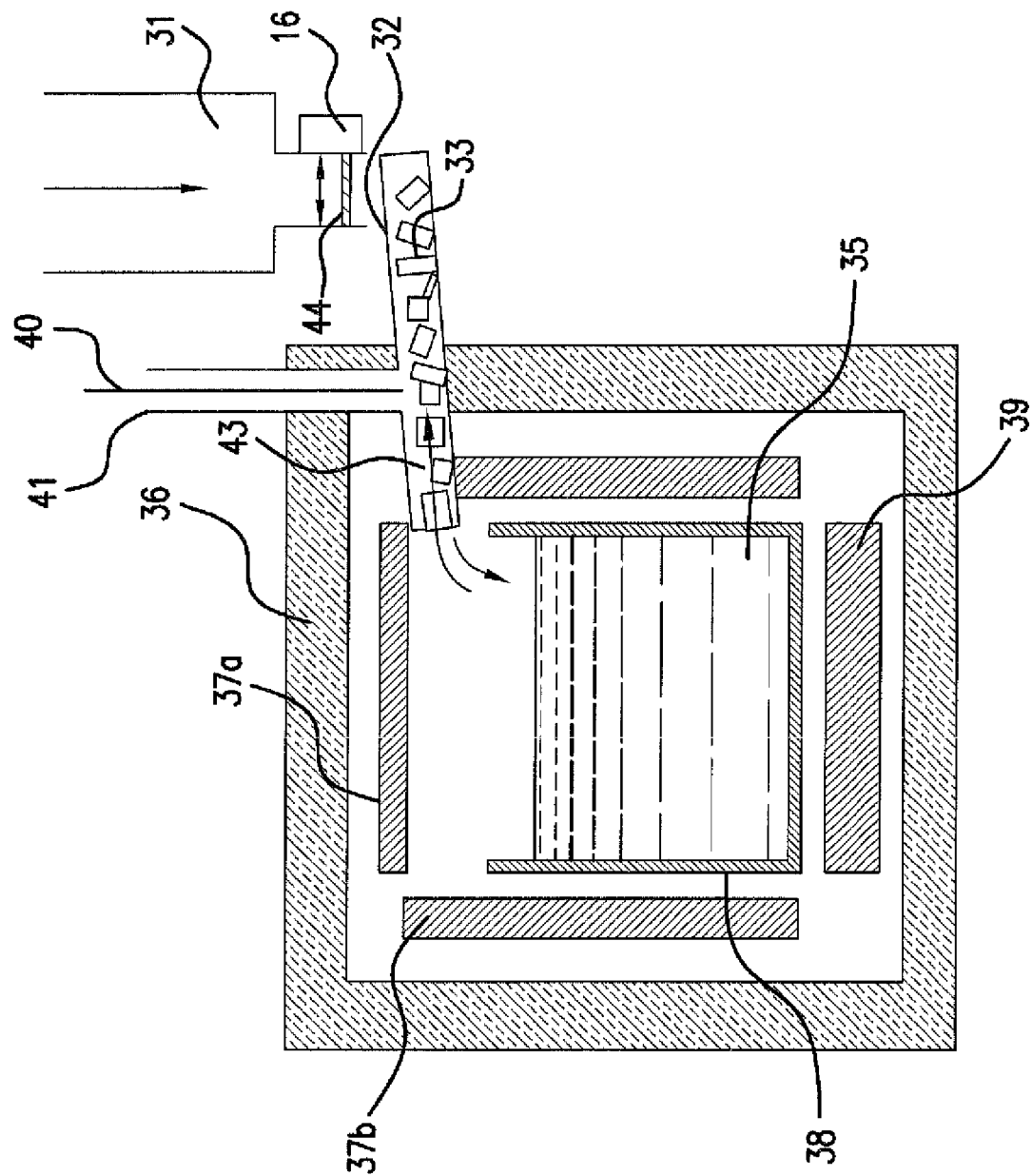
FIG. 4 is a schematic sectional view of a device for producing monocrystalline or polycrystalline silicon according to a further embodiment of the invention.

In the case of the exemplary embodiment according to FIG. 4, heat is introduced, the construction of the crystallization system otherwise being the same, by irradiation with a beam 10 of a $CO_2$ laser which is coupled into the conveying means 32 via a window 41 and a beam guide. Suitable imaging optics ensure suitable expansion or imaging of the laser beam onto the raw material spread flat on the conveying means 32. The conveying means 32 is composed of a shaker and a shaking channel and can be displaced in horizontal direction.

Figure 5:
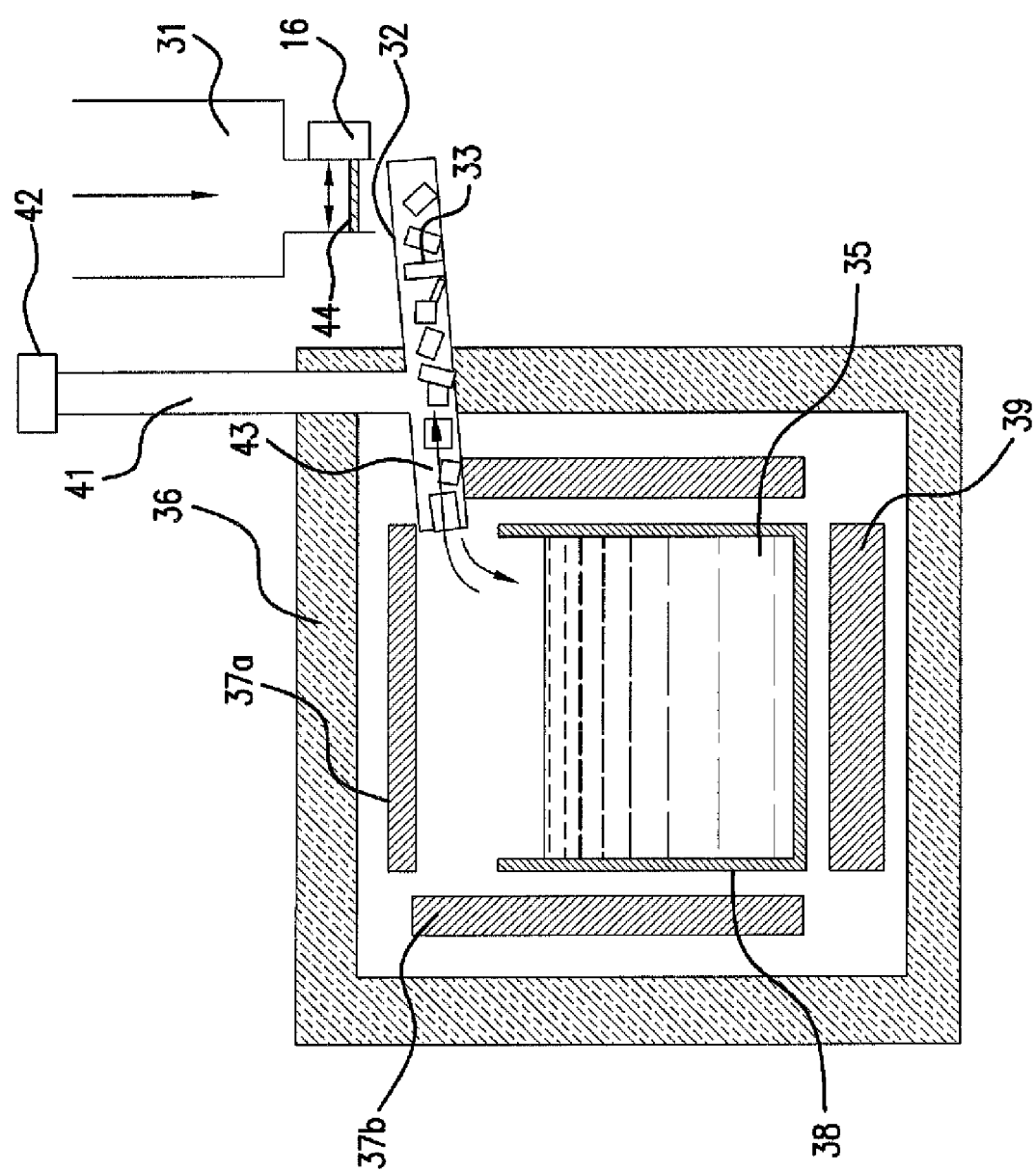
FIG. 5 is a schematic sectional view of a device for producing monocrystalline or polycrystalline silicon according to a further embodiment of the present invention.

In the case of the embodiment according to FIG. 5, heat is introduced, the construction of the crystallization system otherwise being the same, by microwave radiation which is coupled into the raw material conveyed by the conveying means 32 by a magnetron 42 via a waveguide 41.

Figure 6:
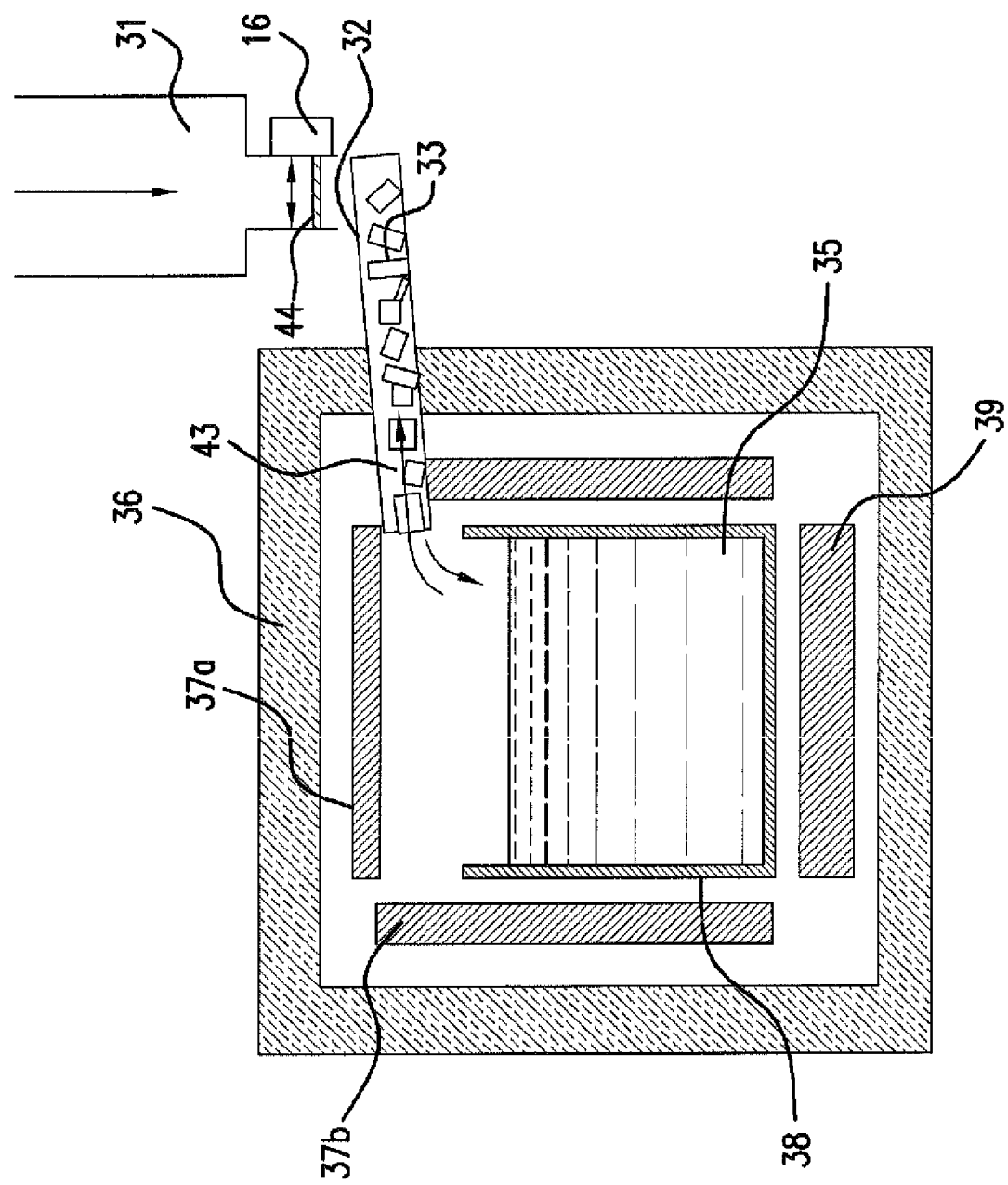
FIG. 6 is a schematic illustration of a device for producing monocrystalline or polycrystalline silicon according to a further embodiment of the present invention.

In the case of a variant of the fourth embodiment, as shown in FIG. 6, the distance between the center of the melting crucible 8 and the leading end of the conveying means conveying means 32 can be shortened, the construction of the crystallization system otherwise being the same, by horizontal displacement of the conveying means 32 during introduction of the raw material. This effectively prevents splashing and mechanical damage to an inner coating of the melting crucible 38. According to FIG. 6, heat is introduced in order to preheat the additionally introduced raw material via the upper heater.

As a result of the guidance of the flushing gas 43 in countercurrent to the raw material to be replenished, which guidance can also optionally be switched on and off again, additional heating may, in the case of a low conveyance flow or maximum heating powers, be dispensed with for some of the time.

As will be readily apparent to a person skilled in the art, use may also be made, in the case of the crystallization system according to the invention, of any other desired conveying means which are sufficiently stable to heat and can convey pourable or free-flowing raw material into the melting crucible. Preferred in this case are materials which have low electrical conductivity and do not contaminate silicon, for example silicon nitride ($Si_3N_4$), silicon carbide (SiC) or the aforementioned fiber composite ceramics, such as for example CFC or CSiC (carbon fiber-reinforced carbon or silicon carbide).

As stated hereinbefore, use is made, for conveying the semiconductor raw material, preferably of two shaking channels, arranged in series one after the other, as described hereinbefore with reference to FIG. 1. Such an arrangement in series has the advantage that the first, upstream shaker can be switched off, so that the raw material simply continues to lie on the first shaking channel if an interruption in the feed of raw material is desirable. In the event of an interruption of the feed of raw material, the second shaker then continues to operate until no more raw material is located on the second, downstream shaking channel. Then, the second shaking channel can be withdrawn, in particular extracted completely out of the heat insulation of the crystallization system. According to a further preferred embodiment allowing the equipment costs to be further reduced, a common shaker, which shakes both shaking channels, is in this case associated with the first and second shaking channel. In order to interrupt the feed of raw material, use is made of a blocking element 44, for example a blocking slide or the like, which is associated with the metering and supply container 31 and selectively blocks the outlet thereof, and the common shaker is then allowed to run until both shaking channels have completely emptied.

In the case of the embodiments according to FIG. 3 to 6, the front part of the shaking channel protrudes into the portion between the upper heater and melt surface, with the raw material feedstock which may be located thereon, and is exposed in this way to comparatively intensive heat radiation. In order to avoid excessively strong thermal loading of the shaking channel, the shaking channel, or, in the case of embodiments with two shaking channels arranged in series one after the other, the downstream shaking channel, can be displaceably arranged in order in this way to be able to be completely extracted from the crystallization system. Thus either the complete unit comprising the supply and metering container 31 and the conveying means 32 or only components thereof is or are then available for use in an adjacent crystallization system having a comparable construction. Thus, a further aspect of the present invention relates to a device for producing a monocrystalline or multicrystalline semiconductor material by way of directional solidification of a semiconductor raw material melt, wherein the device comprises at least two crystallization systems, as described hereinbefore, and only one unit comprising a supply and metering container and conveying means. Of course, it is also possible to combine at least two crystallization systems and at least two conveying means with only one supply and metering container or to combine at least two crystallization systems and at least two dupply and metering containers with only one conveying means.

The operation of the crystallization system according to FIGS. 1 and 3 to 6 will be described hereinafter in greater detail based on preferred exemplary embodiments.

Exemplary Embodiment 1

The surface temperature of the silicon feedstock in the melting crucible is continuously detected with the aid of a temperature sensor. It is thus possible to ascertain that and when the melting temperature of silicon is reached. Depending on the heating power for heating the melting crucible, the silicon feedstock slumps more or less rapidly. The silicon feedstock melts in this case from the surface. A predetermined time after reaching the melting temperature of silicon, additional silicon raw material is introduced into the melting crucible with the aid of the conveying means. The conveying rate is in this case adjusted in a suitable manner as a function of the actual heating power. The amount of silicon raw material that is actually introduced into the melting crucible is detected with the aid of the sensor. The silicon feedstock slumps continuously in the melting crucible. The additional silicon raw material can be introduced continuously or at predetermined intervals and metering amounts, in each case in accordance with the actual heating power. The additional silicon raw material is heated by the purposeful introduction of heat to a temperature just below the melting temperature of silicon, so that the melt in the melting crucible cools down only slightly and can quickly be brought back up to the prescribed operating temperature.

Exemplary Embodiment 2

The surface temperature of the silicon feedstock in the melting crucible is continuously detected with the aid of a temperature sensor. A central control means previously detected what amount of silicon feedstock has been introduced in the melting crucible. Or this amount can be input into the central control means. A predetermined amount of additional raw material is replenished to the melting crucible as a function of the current heating power and the amount of raw material currently located in the melting crucible. This replenishment can take place continuously or in a plurality of time-delayed steps at each of which a predefined amount of additional raw material is introduced. The additional silicon raw material is heated by the purposeful introduction of heat to a temperature just below the melting temperature of silicon, so that the melt in the melting crucible cools down only slightly and can quickly be brought back up to the prescribed operating temperature.

Exemplary Embodiment 3

A sensor is used continuously to detect the surface temperature of the crucible filling and therefore to determine the point in time at which the melting temperature of silicon is reached. A predetermined time after reaching the melting point, a predetermined amount of additional raw material is replenished to the melting crucible as a function of the actual heating power. This step is repeated after predetermined time intervals, in accordance with the current heating power, until a predetermined filling level of the melting crucible is reached. The additional silicon raw material is heated by the purposeful introduction of heat to a temperature just below the melting temperature of silicon, so that the melt in the melting crucible cools down only slightly and can quickly be brought back up to the prescribed operating temperature.

Exemplary Embodiment 4

The surface temperature of the crucible filling is continuously monitored with the aid of a temperature sensor. Furthermore, the filling level of the melting crucible is continuously monitored with the aid of a visual inspection system and/or a distance sensor. After a drop in the filling level by a predetermined height, caused by the volumetric shrinkage of the silicon feedstock, a predetermined amount of additional raw material is replenished to the melting crucible. This step is repeated when the filling level of the melting crucible has, after the replenishment, again dropped by a second predetermined height. The height by which the filling level drops between the individual replenishment steps is reduced owing to the increasing filling of the melting crucible. Alternatively, instead of operating in discrete predetermined steps, the replenishment of raw material can also be triggered whenever a predetermined filling level of the melting crucible is undershot. The additional silicon raw material is heated by the purposeful introduction of heat to a temperature just below the melting temperature of silicon, so that the melt in the melting crucible cools down only slightly and can quickly be brought back up to the prescribed operating temperature.

The melting point of silicon is specified in a very narrowly defined temperature range. However, the phase diagrams of other materials can differ considerably in the range of the melting point. Therefore, the visual inspection system can also provide further information concerning the composition of the crucible filling and the existence of what is known as a "sludge zone". In particular, the image evaluation of the visual inspection system can take place in a manner similar to that disclosed in EP 1 337 697 B1, the entire content of which is expressly included by way of reference for the purposes of disclosure. Such image evaluation can in particular also be adduced to determine surface regions of the crucible filling that have not yet melted.

The position in which the semiconductor raw material introduced by the first conveying means enters the melting crucible can, according to a further embodiment, also be varied by adjusting the leading end of the first conveying means, including in particular in accordance with the evaluation of the information of the visual inspection system. According to a further embodiment, the leading end of the first conveying means can also be moved back and forth in order to standardize the introduction of the raw material into the melting crucible over the entire surface of the crucible filling. As will be readily apparent to a person skilled in the art, the method according to the invention is suitable not only for the production of polycrystalline silicon using the VGF method but rather also for the production of any desired monocrystals, in particular of germanium and calcium fluoride monocrystals.

What is claimed is:

1. A method for producing a monocrystalline or polycrystalline semiconductor material using a vertical gradient freeze method, wherein lumpy semiconductor raw material is introduced into a melting crucible and melted therein and directionally solidified, in which method a temperature profile is established from the upper end to the base of the melting crucible, said temperature profile being axially displaced in such a way that the phase boundary separating the liquid phase from the crystallized-out material migrates, starting from the base of the melting crucible, gradually toward the upper end of the melting crucible, in which method the semiconductor raw material is melted from the upper end of the melting crucible, so that molten material trickles downward and semiconductor raw material which has not yet melted gradually slumps in the melting crucible and additional semiconductor raw material is replenished to the melting crucible from above onto a zone of semiconductor raw material which has not yet melted or not completely melted, in order at least partly to compensate for a volumetric shrinkage of the semiconductor raw material.

2. The method as claimed in claim 1, wherein the semiconductor raw material to be replenished is heated by the purposeful introduction of heat to a temperature below the melting temperature of the semiconductor raw material and the semiconductor raw material is introduced into the container in the heated state.

3. The method as claimed in claim 2, wherein the purposeful introduction of heat takes place on the inside of a heat insulation of the melting furnace receiving the melting crucible.

4. The method as claimed in claim 3, wherein the purposeful introduction of heat takes place under the action of electromagnetic radiation.

5. The method as claimed in claim 4, wherein the electromagnetic radiation acts selectively by imaging heat radiation or radiation from an optical radiation source, in particular a laser, or by applying microwave radiation or high or medium-frequency radiation to the semiconductor raw material in order to heat said material.

6. The method as claimed in claim 1, wherein the solid, lumpy semiconductor raw material is during transportation spread flat by a conveying means and the purposeful introduction of heat takes place into the semiconductor raw material which has already been spread flat.

7. The method as claimed in claim 6, wherein the solid, lumpy semiconductor raw material is during transportation spread flat to form a single or double layer, preferably to form a single layer.

8. The method as claimed in claim 7, wherein the conveying means conveys the semiconductor raw material from the lower end of a semiconductor raw material supply and metering container into a melting furnace receiving the melting crucible.

9. The method as claimed in claim 8, wherein a leading end of the conveying means is moved, prior to the introduction of the semiconductor raw material, through heat insulation of the melting furnace into the interior of the melting furnace.

10. The method as claimed in claim 6, wherein during transportation through the conveying means a flushing gas sweeps in the opposite direction over the semiconductor raw material in order to free the heated semiconductor raw material of adsorbed $H_2O$.

11. The method as claimed in claim 6, wherein for introducing the semiconductor raw material, a leading end of the conveying means is moved by horizontal displacement of the conveying means toward the center of the melting crucible in such a way that the semiconductor raw material is preheated by a upper heater.

12. The method as claimed in claim 1, wherein the semiconductor raw material is melted in the melting crucible from the upper end thereof in such a way that the zone extends as a strip of semiconductor raw material which has not yet melted or is not completely melted over the entire cross section of the melting crucible.

13. The method as claimed in claim 1, wherein a surface temperature of the semiconductor raw material is continuously detected in the melting crucible and the additional semiconductor raw material is introduced as a function of the detected surface temperature.

14. The method as claimed in claim 13, wherein the additional semiconductor raw material is introduced continuously into the melting crucible after a predetermined period of time or immediately after reaching the melting temperature of the semiconductor raw material at a rate corresponding to the heating power for heating the melting crucible.

15. The method as claimed in claim 13, wherein as a function of the heating power for heating the melting crucible and of the amount of semiconductor raw material currently located in the melting crucible, a predetermined amount of the additional semiconductor raw material is replenished to the melting crucible.

16. The method as claimed in claim 13, wherein on the basis of the detected surface temperature of the semiconductor raw material in the melting crucible, a point in time is determined at which the melting temperature of the semiconductor raw material has been reached, and wherein after a predetermined period of time after the point in time as a function of the heating power a predetermined amount of the additional semiconductor raw material is replenished to the melting crucible.

17. The method as claimed in claim 1, wherein a filling level of the melting crucible is continuously monitored and after lowering of the filling level by a predetermined height, which is dependent on the current filling level, a predetermined amount of the additional semiconductor raw material is replenished to the melting crucible.

18. The method as claimed in claim 17, wherein the filling level is monitored by distance measurement, in particular laser distance measurement.

19. The method as claimed in claim 15, wherein the step of replenishment is repeated until the melting crucible is filled up to close to its upper edge with a melt.

20. The method as claimed in claim 1, wherein the additional semiconductor raw material is homogenized or spread flat to form a layer of uniform thickness during replenishment over the cross section of the melting crucible.

21. The method as claimed in claim 1, wherein the additional semiconductor raw material is introduced by means of at least two conveying means, of which one conveying means is located upstream of and outside a heated region and another conveying means is arranged downstream of said one conveying means and at least partly within the heated region.

22. The method as claimed in claim 1, wherein additional semiconductor raw material is introduced by means of one conveying means having a shaking means, wherein for replenishment of the additional semiconductor raw material, the issuing of semiconductor raw material from a supply container is released and the shaking means activated and the shaking means continues to be operated after completion of the issuing of the semiconductor raw material from the supply container for at least a predetermined time in order completely to free at least the conveying channel of the conveying means of the semiconductor raw material.

23. The method as claimed in claim 1, wherein a filling level of the melting crucible is continuously monitored and the replenishment of the additional semiconductor raw material is broken off before the melting crucible has been overfilled.

24. A method for producing a monocrystalline or polycrystalline semiconductor material vertical gradient freeze method wherein lumpy semiconductor raw material is introduced into a melting crucible and melted therein and directionally solidified, in which method a temperature profile is established from the upper end to the base of the melting crucible said temperature profile being axially displaced in such a way that the phase boundary separating the liquid phase from the crystallized-out material migrates, from the base of the melting crucible, gradually toward the upper end of the melting crucible, in which method the semiconductor raw material is melted from the upper end of the melting crucible, so that molten material trickles downward and semiconductor raw material which has not yet melted gradually slumps in the melting crucible and additional semiconductor raw material is replenished to the melting crucible from above onto a zone of semiconductor raw material which has not yet melted or not completely melted, in order at least partly to compensate for a volumetric shrinkage of the semiconductor raw material;

wherein the semiconductor raw material is pourable or free-flowing polycrystalline silicon, the semiconductor raw material being discontinuously heated and introduced into the crucible.

* * * * *

UNITED STATES PATENT AND TRADEMARK OFFICE
CERTIFICATE OF CORRECTION

| | | |
|---|---|---|
| PATENT NO. | : 8,101,019 B2 | Page 1 of 1 |
| APPLICATION NO. | : 12/334646 | |
| DATED | : January 24, 2012 | |
| INVENTOR(S) | : Sahr et al. | |

It is certified that error appears in the above-identified patent and that said Letters Patent is hereby corrected as shown below:

Column 15, line 15, add a --,-- after the word method.

Column 15, line 19 add a --,-- after the word crucible.

Column 16, line 1 after the word migrates add the word --starting--.

Signed and Sealed this
Twenty-ninth Day of May, 2012

David J. Kappos
*Director of the United States Patent and Trademark Office*